US008030139B2

(12) United States Patent
Asano et al.

(10) Patent No.: US 8,030,139 B2
(45) Date of Patent: Oct. 4, 2011

(54) THIN FILM TRANSISTOR AND METHOD OF PRODUCING THIN FILM TRANSISTOR

(75) Inventors: Takeshi Asano, Nagoya (JP); Taishi Takenobu, Sendai (JP); Masashi Shiraishi, Toyonaka (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 246 days.

(21) Appl. No.: 12/383,523

(22) Filed: Mar. 25, 2009

(65) Prior Publication Data

US 2009/0224292 A1 Sep. 10, 2009

Related U.S. Application Data

(63) Continuation-in-part of application No. PCT/JP2008/052833, filed on Feb. 20, 2008.

(30) Foreign Application Priority Data

Feb. 21, 2007 (JP) ................................ 2007-040679

(51) Int. Cl.
*H01L 21/00* (2006.01)
*H01L 21/84* (2006.01)
(52) U.S. Cl. .......... 438/149; 438/99; 438/311; 438/781; 257/E21.007; 257/E21.051; 257/E21.077; 257/E21.128; 257/E21.264; 257/E21.266; 257/E21.32; 257/E21.324; 257/E21.411
(58) Field of Classification Search .................. 438/149, 438/99, 311, 509, 584, 680, 725, 781; 257/E21.007, 257/51, 77, 17, 128, 264, 266, 32, 324, 411
See application file for complete search history.

(56) References Cited

U.S. PATENT DOCUMENTS

| 6,590,231 | B2 * | 7/2003 | Watanabe et al. | 257/77 |
| 7,528,448 | B2 * | 5/2009 | Bailey et al. | 257/352 |
| 7,667,230 | B2 * | 2/2010 | Zhu et al. | 257/40 |
| 7,744,717 | B2 * | 6/2010 | Andrews et al. | 156/247 |
| 2004/0023514 | A1 * | 2/2004 | Moriya et al. | 438/778 |
| 2007/0059947 | A1 | 3/2007 | Moriya et al. | |
| 2007/0065974 | A1 * | 3/2007 | Shiraishi et al. | 438/99 |

FOREIGN PATENT DOCUMENTS

JP 2004071654 A 3/2004
(Continued)

OTHER PUBLICATIONS

Tanaka, Satoshi et al., 10p-R-14 "Field-Effect Transistors Using Highly Dispersed Carbon Nanotubes/Polymer Composite Films Using an Ultracentrifuge", p. 1174, Extended Abstracts (The 66th Autumn Meeting, 2005), The Japan Society of Applied Physics No. 3, Sep. 7, 2005.

*Primary Examiner* — David Nhu
(74) *Attorney, Agent, or Firm* — Day Pitney LLP

(57) ABSTRACT

A method of producing a thin film transistor includes a gate electrode formation step that forms a gate electrode on a substrate, a gate insulating layer formation step that forms a gate insulating layer on the substrate in such a manner as to cover the gate electrode formed in the gate electrode formation step, a source/drain electrodes formation step that forms a source electrode and a drain electrode on the gate insulating layer, and a semiconductor layer formation step that applies an aqueous solution for semiconductor layer formation which is an aqueous solution comprising at least a single wall carbon nanotube and a surfactant between the source electrode and the drain electrode formed in the source/drain electrodes formation step by a coating process to form a semiconductor layer comprising the single wall carbon nanotube.

10 Claims, 17 Drawing Sheets

FOREIGN PATENT DOCUMENTS

| JP | 2005093472 | | 4/2005 |
| JP | 2005101424 | A | 4/2005 |
| JP | 2005209736 | A | 8/2005 |
| JP | 2007031238 | A | 2/2007 |

* cited by examiner

THIN FILM TRANSISTOR AND METHOD OF PRODUCING THIN FILM TRANSISTOR

This application is a U.S. continuation-in-part application filed under 35 USC 111(a) claiming benefit under 35 USC 120 and 365(c) of International Application No. PCT/JP2008/052833 filed Feb. 20, 2008, which claims priority to Application Ser. No. 2007-040679, filed in Japan on Feb. 21, 2007. The disclosure of the foregoing applications is hereby incorporated by reference in their entireties.

BACKGROUND

The present disclosure relates to a thin film transistor and a method of producing the thin film transistor, and more specifically to a thin film transistor provided with a semiconductor layer containing a carbon nanotube and a method of producing the thin film transistor.

An active driving circuit provided with a thin film transistor (TFT) has heretofore been embedded in each of pixels of a bright and easy-to-view flexible display such as an organic EL, a film liquid crystal, and an electronic paper. Among TFTs, an organic TFT using an organic semiconductor can be produced at ordinary temperatures and is expected to be the one that can be formed on a flexible plastic substrate at a low cost. Meanwhile, the organic TFT has problems such as low carrier mobility and poor environmental stability.

As a countermeasure, there have been proposed a semiconductor element using as a semiconductor layer obtained by printing or applying a gel composition formed of a carbon nanotube and an ionic liquid on a substrate and a method of producing the semiconductor element (see Japanese Patent Application Laid-Open (JP-A) No. 2005-209736, for example). There has also been proposed a method of producing a field effect semiconductor device obtained by dispersing a carbon nanotube into a solvent such as ethanol or dimethylformamide and depositing and dry-fixing the carbon nanotube in a predetermined pattern (see JP-A-2005-93472, for example). According to the semiconductor elements and the production methods therefor disclosed in JP-A-2005-209736 and JP-A-2005-93472, it is possible to form a semiconductor layer having high mobility due to excellent material characteristics of the carbon nanotube such as high electron speed and high current density. Also, since the carbon nanotube has high flexibility and is a strong and thin threadlike material, the carbon nanotube is suitably used for flexible displays.

However, the semiconductor element and the production method therefor disclosed in JP-A-2005-209736 and the production method for the field effect semiconductor device disclosed in JP-A-2005-93472 have both of advantages and drawbacks. For example, according to the semiconductor element and the production method therefor disclosed in JP-A-2005-209736, since the gel composition containing the carbon nanotube and the ionic liquid is used in forming a semiconductor layer, there is an advantage that the semiconductor layer can be formed by a wet processing such as coating. Meanwhile, since the ionic liquid mentioned above is in the form of a gel, there is a drawback that the semiconductor layer cannot be formed by a simple coating process such as an inkjet method. Also, the production method for the field effect semiconductor device disclosed in JP-A-2005-93472 has an advantage that manufacturing by a simple method is possible. Meanwhile, since it is difficult to uniformly arrange the carbon nanotubes due to poor dispersibility of the carbon nanotubes, there is a drawback of a large variation in characteristics of the thin film transistors to be produced. In a microscopic device such as the flexible display, the variation in characteristics of the thin film transistor greatly influences on operation of the whole device. Therefore, there has been a strong demand for establishment of a method of producing a thin film transistor having stable transistor characteristics.

SUMMARY

An object of this disclosure is to provide a thin film transistor having stable transistor characteristics and provided with a semiconductor layer comprising a carbon nanotube as well as a simple production method for such a thin film transistor.

To solve the problems described above, in a first aspect of this disclosure, a method of producing a thin film transistor including a gate electrode formation step that forms a gate electrode on a substrate, a gate insulating layer formation step that forms a gate insulating layer on the substrate in such a manner as to cover the gate electrode formed in the gate electrode formation step, a source/drain electrodes formation step that forms a source electrode and a drain electrode on the gate insulating layer, and a semiconductor layer formation step that applies an aqueous solution for semiconductor layer formation which is an aqueous solution comprising at least a single wall carbon nanotube and a surfactant between the source electrode and the drain electrode formed in the source/drain electrodes formation step by a coating process to form a semiconductor layer comprising the single wall carbon nanotube.

To solve the problems described above, in a second aspect of this disclosure, a thin film transistor is produced by the method of producing a thin film transistor described above.

To solve the problems described above, in a third aspect of this disclosure, a method of producing a thin film transistor including a source/drain electrodes formation step that forms a source electrode and a drain electrode on a substrate, a semiconductor layer formation step that applies an aqueous solution for semiconductor layer formation which is an aqueous solution comprising at least a single wall carbon nanotube and a surfactant between the source electrode and the drain electrode formed in the source/drain electrodes formation step by a coating process to form a semiconductor layer comprising the single wall carbon nanotube, a gate insulating layer formation step that forms a gate insulating layer in such a manner as to cover surfaces of the source electrode, the drain electrode, and the semiconductor layer, and a gate electrode formation step that forms a gate electrode on the gate insulating layer formed in the gate insulating layer formation step.

To solve the problems described above, in a third aspect of this disclosure, a thin film transistor is produced by the method of producing a thin film transistor described above.

Other objects, features, and advantages of the present disclosure will be apparent to persons of ordinary skill in the art in view of the following detailed description of embodiments of the invention and the accompanying drawings.

BRIEF DESCRIPTION OF THE DRAWINGS

Exemplary embodiments will be described below in detail with reference to the accompanying drawings in which.

DETAILED DESCRIPTION OF THE EXEMPLARY EMBODIMENTS

Hereinafter, as one example of a thin film transistor and a production method therefor obtained by embodying the present disclosure, first and second embodiments will be described in this order with reference to the drawings. Firstly, a structure of a thin film transistor 1 according to the first embodiment will be described with reference to FIGS. 1 and 2.

Figure 1:
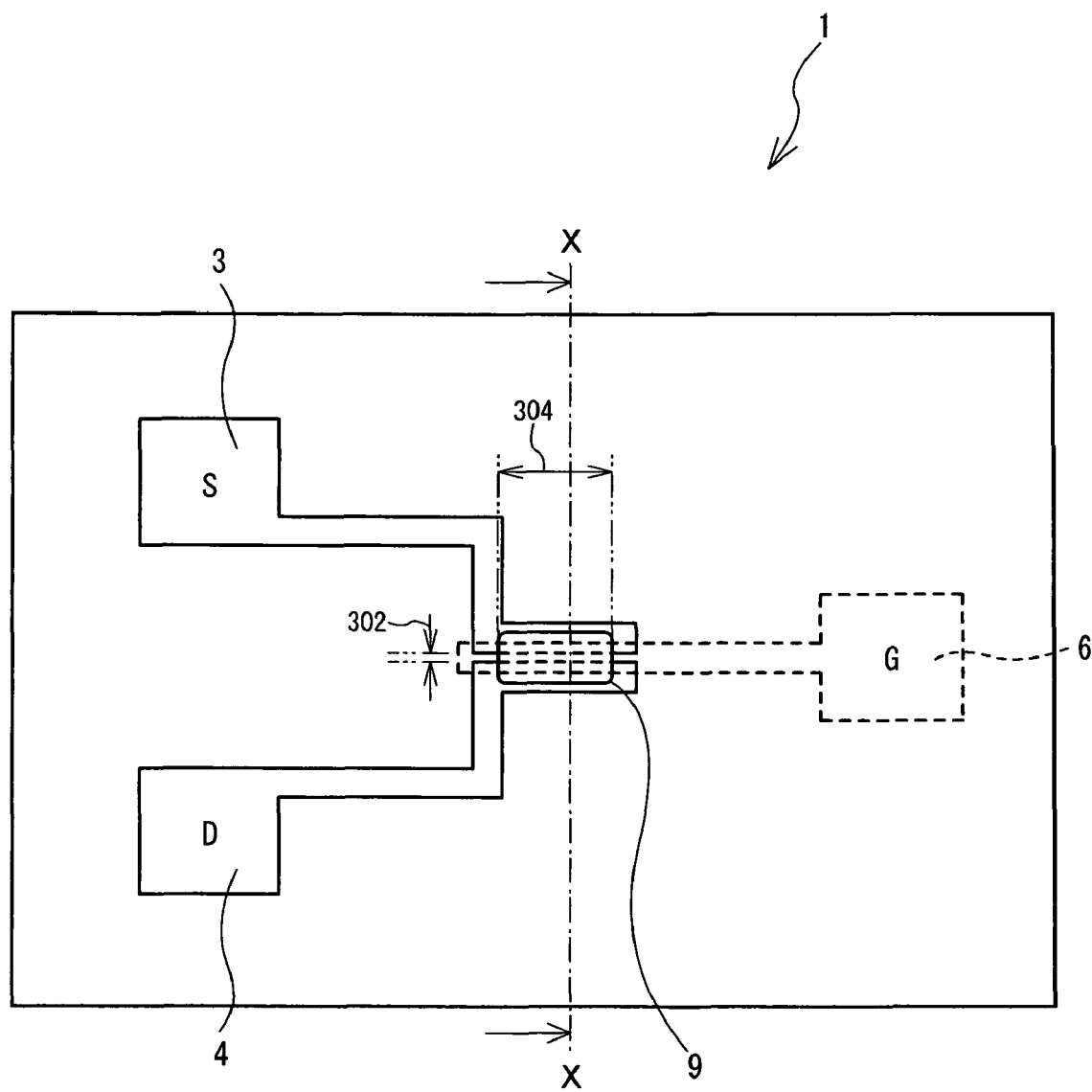
FIG. 1 is a plan view of a thin film transistor.
Figure 2:
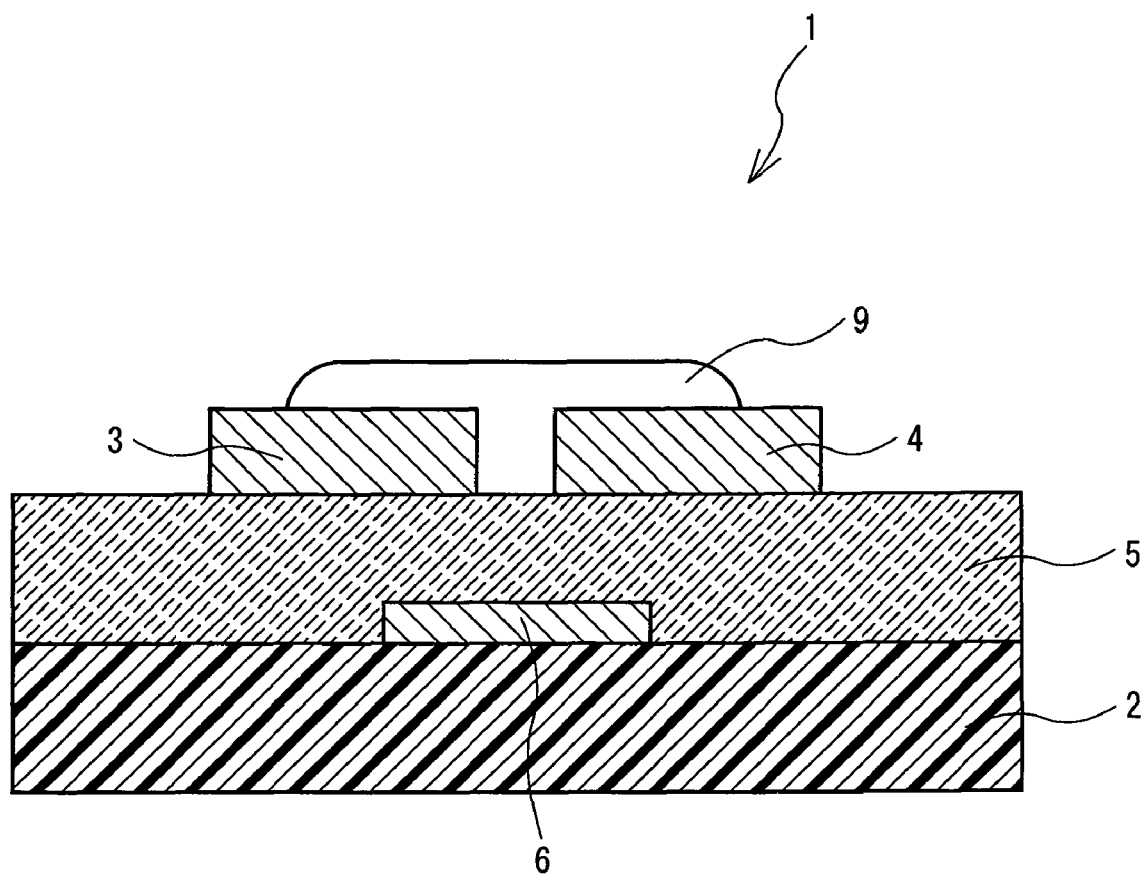
FIG. 2 is an enlarged partial sectional view of a part on which a semiconductor layer is formed taken along the line X-X and viewed in a direction of the arrows in FIG. 1.

The thin film transistor 1 shown in FIGS. 1 and 2 is a thin film transistor of a so-called "bottom gate type". The thin film transistor of "bottom gate type" has a gate electrode 6 that is positioned below (closer side to a substrate 2) a source electrode 3 and a drain electrode 4. The thin film transistor 1 is provided with the substrate 2 having a predetermined thickness and in the form of a plate. The substrate 2 is a member for supporting respective members forming the thin film transistor 1. As the substrate 2, materials having an insulating property and in the form of a plate such as, for example, a glass substrate and a plastic substrate are usable. In the case of imparting flexibility to the substrate, the plastic substrate is used. Specific examples of a material for the plastic substrate include polyether sulfone (PES), polyethylene terephthalate (PET), polyimide (PI), and polyethylene naphthalate (PEN). In addition, various underlayers (films) such as a contact layer for improving contact between the substrate 2 and the source electrode 3 and between the substrate 2 and the drain electrode 4 may be provided on the substrate 2.

The patterned gate electrode 6 is formed in a strip-like shape with a predetermined width (100 μm, for example) on a central part of an upper surface of the substrate 2. A material for the gate electrode 6 contains an electroconductive. Applicable examples of the electroconductive material for the gate electrode 6 include metals such as aluminum (Al), molybdenum (Mo), gold (Au), and chrome (Cr) as well as electroconductive polymers such as poly-3,4-ethylenedioxythiophene (PEDOT). These electroconductive materials may be used alone or in combination of two or more. Here PEDOT is the electroconductive polymer obtained by polymerizing 3,4-ethylenedioxythiophene in a high molecular weight polystyrenesulfonic acid.

Upper surfaces of the substrate 2 and the gate electrode 6 are covered with a gate insulating layer 5. The gate insulating layer 5 is used for insulating the gate electrode 6 from the source electrode 3 and the drain electrode 4 to be described later in this specification and formed in such a manner as to cover the gate electrode 6 by using an inorganic material or an organic material. For example, aluminum oxide ($Al_2O_3$), silicon oxide ($SiO_2$), silicon nitride (SiN), and the like are applicable in the case of using an inorganic material as a material for the gate insulating layer 5. On the other hand, in the case of using an organic material as a material for the gate insulating layer 5, for example, polyimide (PI), polymethylmethacrylate (PMMA), polyparavinylphenol (PVP), and the like are applicable.

The source electrode 3 and the drain electrode 4 are provided respectively on an upper surface of the gate insulating layer 5 with a predetermined gap of channel length between the source electrode 3 and the drain electrode 4. As materials for the source electrode 3 and the drain electrode 4, applicable are metals such as Al, Mo, Au, and Cr etc. as well as a transparent electroconductive material such as indium tin oxide (ITO) and an electroconductive polymer such as PEDOT etc. A "channel" in which a carrier moves is formed between the source electrode 3 and the drain electrode 4. The channel has a predetermined channel length and a predetermined channel width. As used herein, "channel length" is defined as a distance from one end of the source electrode 3 to one end of the drain electrode 4 indicated by arrows 302 in FIG. 1 and is 30 μm in the first embodiment.

A semiconductor layer 9 is provided between the source electrode 3 and the drain electrode 4 in such a manner as to fill up a groove formed by defining the gap between the source electrode 3 and the drain electrode 4 as well as to cover surfaces of the source electrode 3 and the drain electrode 4. The semiconductor layer 9 is disposed in such a manner as to face the gate electrode 6 via the gate insulating layer 5. The semiconductor layer 9 is formed by using an aqueous solution for semiconductor layer formation. The aqueous solution for semiconductor layer formation is an aqueous solution containing a single wall carbon nanotube and a surfactant.

Any one of anionic, cationic, amphoteric, and nonionic surfactants may be used as the surfactant to be contained in the aqueous solution for semiconductor layer formation. Available examples of the anionic surfactant include sodium pyrenebutyrate (SPB), sodium dodecylsulfate (SDS) which is solid (powder) at ordinary temperatures, sodium cholate (CAS), sodium deoxycholate (DOC), and sodium taurodeoxycholate (TDOC). Also, available examples of the anionic surfactant include sodium dodecylbenzenesulfonate (DDBS), dioctyl sulfosuccinate, and sodium salt (DIOCT), which are in the form of a liquid at ordinary temperatures. As the cationic surfactant, usable are, for example, cetyltrimethylammonium bromide (CTABr) and cetylpyridinium chloride (CPCI). Also, as the amphoteric surfactant, usable are, for example, 3-[(3-cholamidopropyl)dimethylammonio] propanesulfonate (CHAPS), and 3-[(3-chloamidopropyl) dimethylammonio]-2-hydroxypropanesulfonate (CHAPSO). Further, available examples of the nonionic surfactant include polyoxyethylene (20) sorbitan monolaurate [Tween (registered trade name by ICI Americas) 20], polyoxyethylene (20) sorbitan monopalmitate [Tween (registered trade name) 40], polyoxyethylene (20) sorbitan monostearate [Tween (registered trade name) 60], polyoxyethylene (20) sorbitan monooleate [Tween (registered trade name) 80], and polyvinylpyrrolidone (PVP). These surfactants may be used alone or in combination of two or more.

Among the above surfactants, the surfactant that is a solid at a room temperature may preferably be used. Since many of the surfactants that are solid at room temperature are usually in the form of powder, such surfactants are easy to handle in the case of preparing the aqueous solution for semiconductor layer formation. In the production method for the thin film transistor 1 described later in this specification, the aqueous solution for semiconductor layer formation is used for forming the semiconductor layer 9. Here, the room temperature in this disclosure means 25° C. More preferably, either one of sodium dexicholate or sodium dodecylsulfate may be used as the surfactant. This is because, in the production method for the thin film transistor 1 described later in this specification, those surfactants are capable of dispersing the single wall carbon nanotube into the aqueous solution for semiconductor formation preferably even in a small amount.

An amount of the surfactant to be added is not particularly limited insofar as the amount causes the single wall carbon nanotubes to be uniformly dispersed. The amount of the surfactant added may be sufficient with about 1% of a total weight of the aqueous solution from a functional point of view. Further, the surfactant can be eliminated by an operation such as washing in the course of production of the thin film transistor 1. In such a case, the surfactant is not contained in the semiconductor layer 9.

Meanwhile as the single wall carbon nanotube to be contained in the aqueous solution for semiconductor layer formation, those containing a semiconductor single wall carbon nanotube may be sufficient to be used. Those in which a proportion of non-aggregated single wall carbon nanotubes is large are preferred since such carbon nanotubes are excellent in switching characteristics as compared with those in which the proportion of non-aggregated single wall carbon nanotubes is small. Also, those in which a proportion of the semiconductor single wall carbon nanotubes is large are preferred since such carbon nanotubes are excellent in switching characteristics as compared with those in which the proportion of semiconductor single wall carbon nanotubes is small. Further, a case in which longitudinal directions of the single wall carbon nanotubes contained in the semiconductor layer 9 are arranged to be parallel to a straight line connecting the source electrode and the drain electrode to each other by a shortest distance is preferred since such a case is excellent in switching characteristics as compared with a case wherein the single wall carbon nanotubes are arranged at random.

The thin film transistor 1 of the first embodiment as described in detail in the foregoing is provided with the semiconductor layer 9 containing the single wall carbon nanotubes. The thin film transistor 1 provided with the semiconductor layer 9 containing the single wall carbon nanotubes is more excellent in carrier mobility as compared with a thin film transistor provided with an organic semiconductor layer. For example, a thin film transistor provided with an organic semiconductor layer formed from polythiophene (solution process) has carrier mobility of $9.4 \times 10^{-3}$ cm$^2$/V·sec. Also, a thin film transistor provided with an organic semiconductor layer formed from pentacene (vacuum vapor deposition) has a carrier mobility of 1 cm$^2$/V·sec. In contrast, a thin film transistor provided with a semiconductor layer containing the single wall carbon nanotubes has carrier mobility of 3 to 10 cm$^2$/V·sec.

The single wall carbon nanotube contained in the semiconductor layer 9 is a threadlike material having high flexibility and high tensile strength. Therefore, the thin film transistor 1 provided with the semiconductor layer 9 has the advantage of being applicable for a flexible device. Also, the single wall carbon nanotubes are substantially uniformly arranged in the semiconductor layer 9. Therefore, it is possible to achieve the thin film transistor 1 having stable transistor characteristics. Consequently, the thin film transistor 1 is able to be suitably used for microscopic devices such as the flexible display etc.

Figure 7:
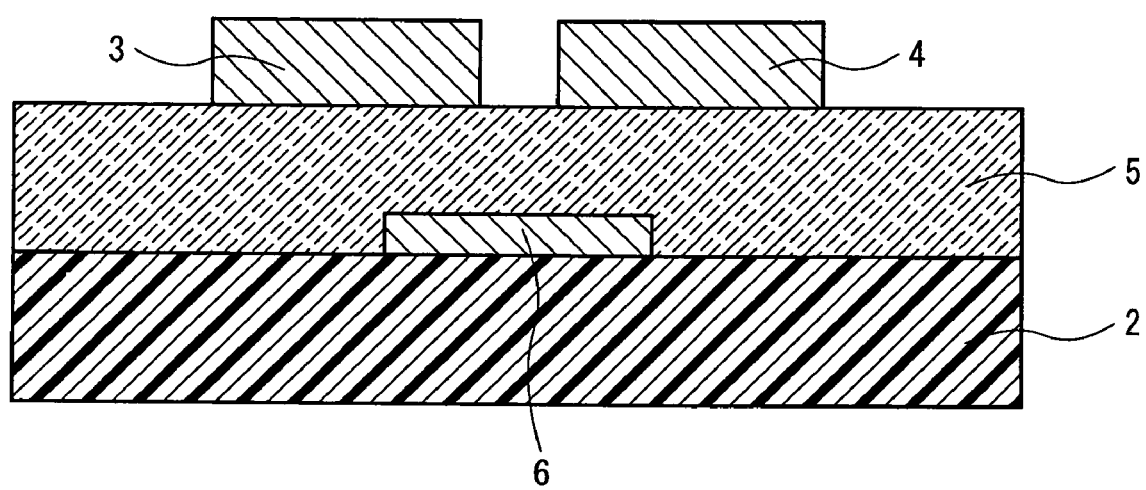
FIG. 7 is an explanatory view for illustrating a state in which a source electrode and a drain electrode are formed on a surface of the gate insulating layer shown in FIG. 6.
Figure 8:
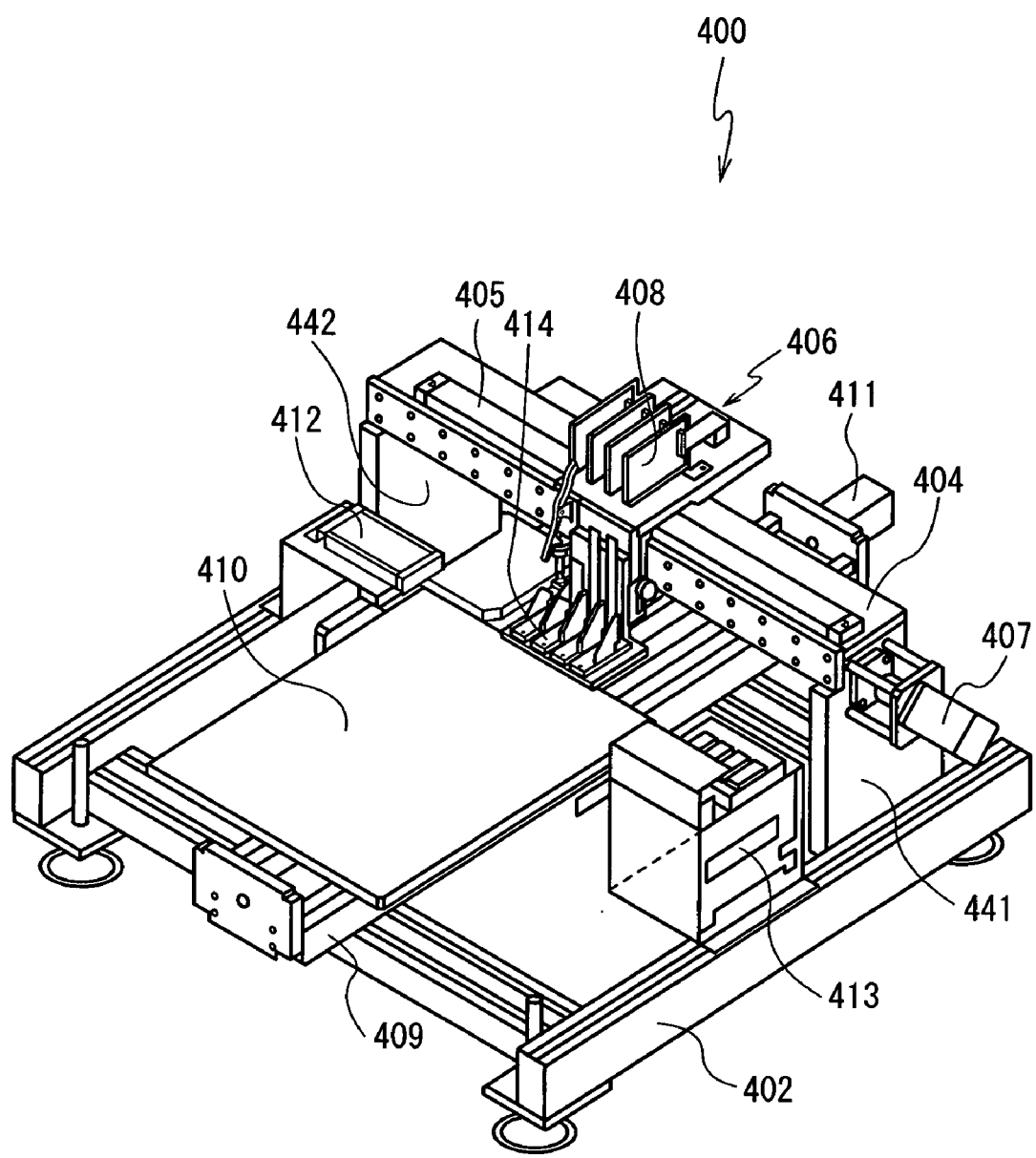
FIG. 8 is a perspective view of an inkjet device for use in a semiconductor layer formation step.
Figure 9:
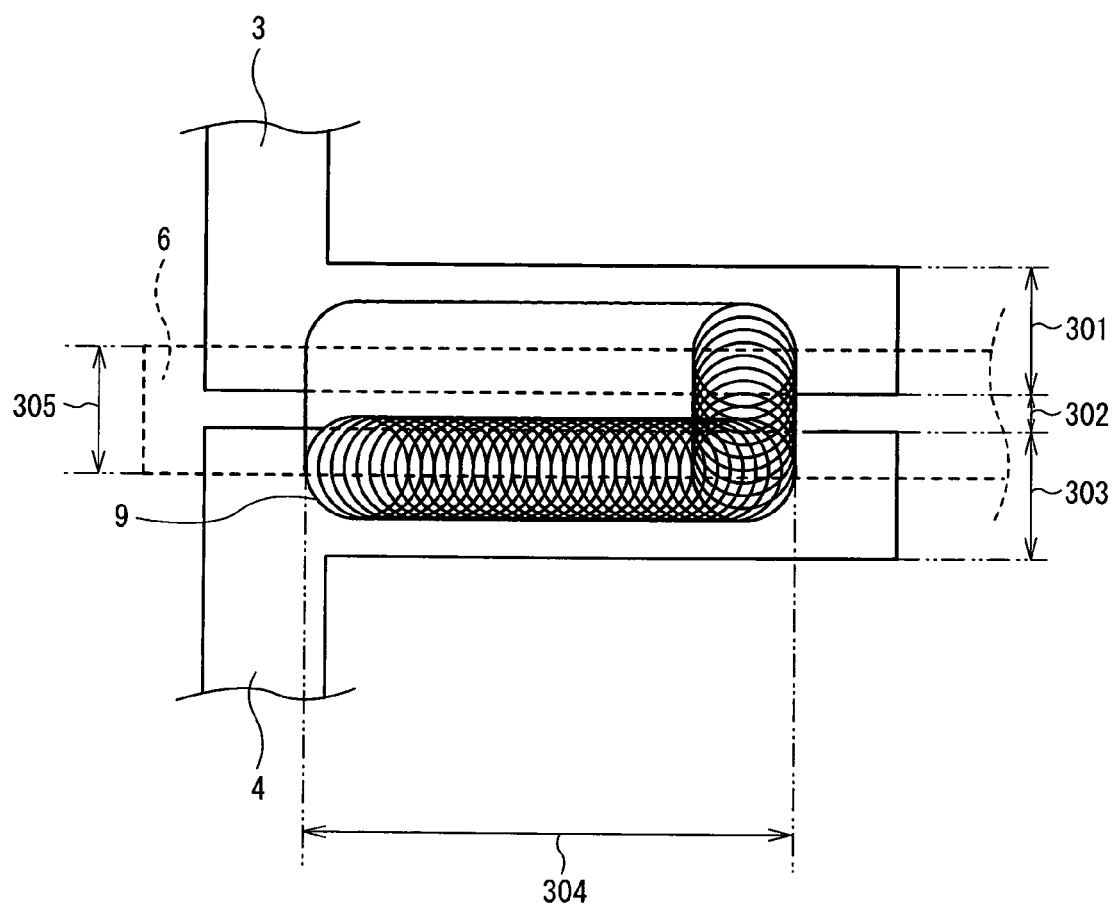
FIG. 9 is an explanatory view for illustrating a state in which the semiconductor layer is formed in such a manner as to cover the source electrode and the drain electrode in the semiconductor layer formation step.

Hereinafter, one example of a method of producing the thin film transistor 1 will be described with reference to FIGS. 3 to 9. The explanatory views of FIGS. 4 to 7 schematically show partial sectional views corresponding to FIG. 2 in respective production steps. Also, the explanatory view of FIG. 9 schematically shows an enlarged plan view of a part on which the semiconductor layer 9 is formed.

Figure 3:
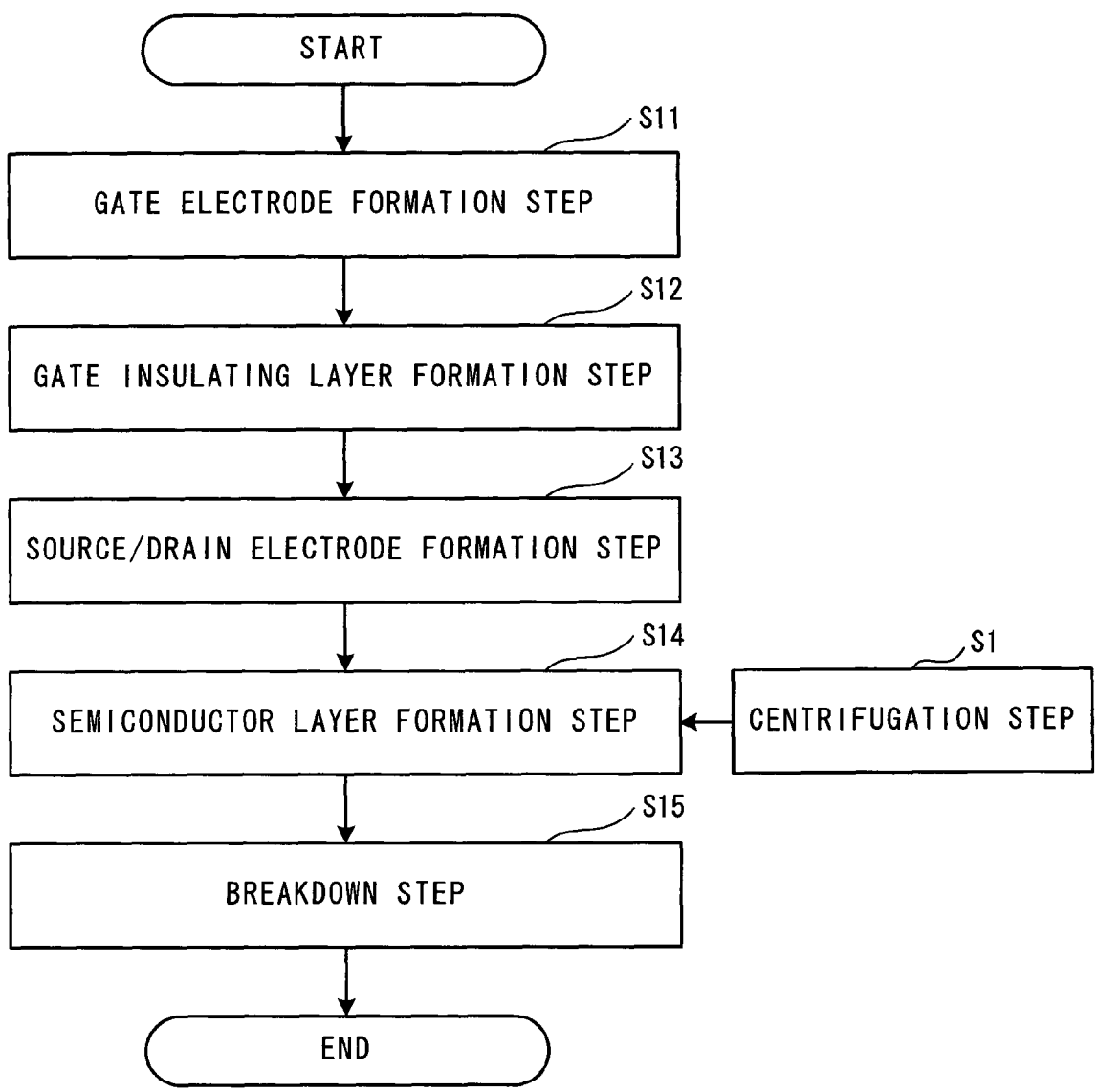
FIG. 3 shows a flow of producing the thin film transistor.

The production method for the thin film transistor 1 includes a gate electrode formation step (S11), a gate insulating layer formation step (S12), a source/drain electrodes formation step (S13), a semiconductor layer formation step (S14), and a break down step (S15) as shown in the production flow of FIG. 3. In the gate electrode formation step (S11), the gate electrode 6 is formed on the upper surface of the substrate 2. In the gate insulating layer formation step (S12), the gate insulating layer 5 is formed on the upper surface of the substrate 2 in such a manner as to cover the gate electrode 6. In the source/drain electrode formation step (S13), the source electrode 3 and the drain electrode 4 are formed respectively on the gate insulating layer 5. In the semiconductor formation step (S14), the semiconductor layer 9 covering the source electrode 3 and the drain electrode 4 is formed. In the break down step (S15), the electroconductive single wall carbon nanotubes contained in the semiconductor layer 9 are burnt off. The aqueous solution for semiconductor layer formation used in the semiconductor layer formation step (S14) is separately prepared in a centrifugation step (S1). In the centrifugation step (S1), the aqueous solution containing the single wall carbon nanotubes and the surfactant is centrifuged to prepare the aqueous solution for semiconductor layer formation. Hereinafter, each of the steps will be sequentially described with reference to the drawings.

Figure 4:
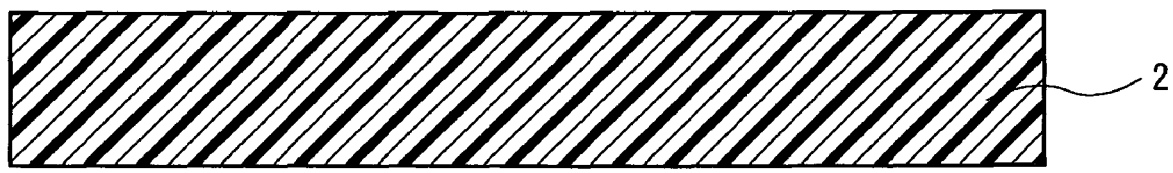
FIG. 4 is an explanatory view for illustrating a substrate.
Figure 5:
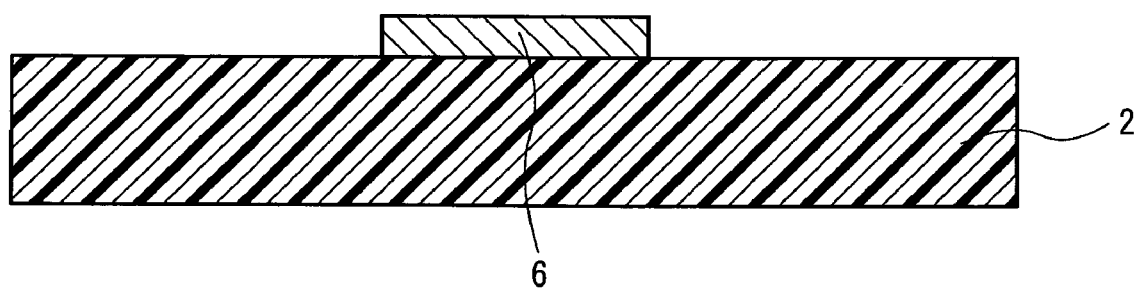
FIG. 5 is an explanatory view for illustrating a state in which a gate electrode is formed on an upper surface of the substrate shown in FIG. 4.

The gate electrode formation step (S11) is first performed. In the gate electrode formation step, the substrate 2 shown in FIG. 4 is sufficiently washed with acetone by applying thereto ultrasonic wave for 5 minutes. Next, the substrate 2 is degassed. Subsequently, the gate electrode 6 is formed on the substrate 2 as shown in FIG. 5. The gate electrode 6 is made from Al and formed by mask vapor deposition. In conditions for the mask vapor deposition in the gate electrode formation step, a vacuum degree is $3 \times 10^{-4}$ Pa, and heating of the substrate 2 is unnecessary. In the first embodiment, the strip-like gate electrode 6 having a film thickness of 60 nm and a width of 100 μm is formed on the upper surface of the substrate 2 in the gate electrode formation step.

Figure 6:
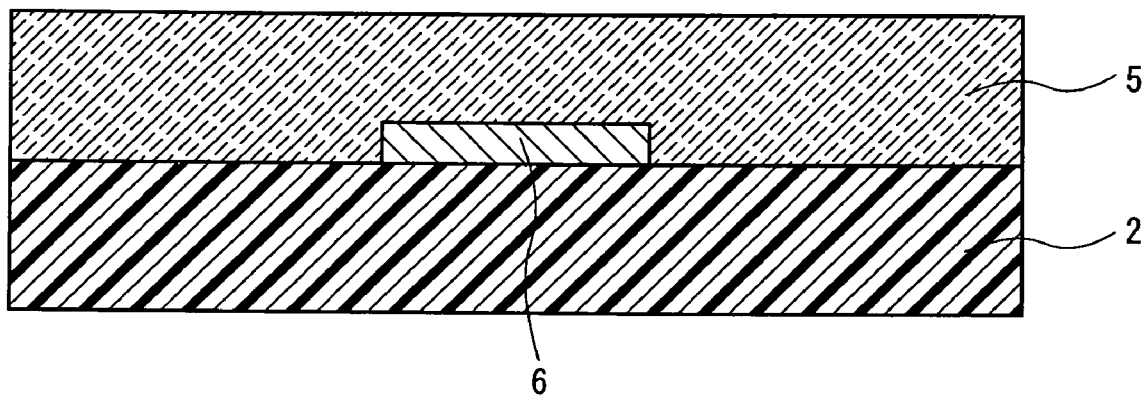
FIG. 6 is an explanatory view for illustrating a state in which a gate insulating layer is formed on an upper surface of the substrate shown in FIG. 5.

Subsequently, the gate insulating layer formation step (S12) is performed. In the gate insulating layer formation step, the gate insulating layer 5 is formed on the upper surface of the substrate 2 on which the gate electrode 6 is formed as shown in FIG. 6. The gate insulating layer 5 contains polyimide (PI). The gate insulating layer 5 is formed by spin coating. In the spin coating, after applying a 5 wt % solution of a high heat resistance polyimide resin (manufactured by Kyocera Chemical Corporation; trade name "CT4112") on the upper surface of the substrate 2, the substrate 2 is rotated horizontally. Thereafter, the substrate 2 is dried at 180° C. for one hour to form the gate insulating layer 5 having a film thickness of 350 nm on the substrate 2. Examples of advantage of the spin coating include easiness of accurately controlling the film thickness of the gate insulating layer 5.

Next, the source/drain electrode formation step (S13) is performed. In the source/drain electrode formation step, the source electrode 3 and the drain electrode 4 are formed respectively on a surface of the gate insulating layer 5 as shown in FIG. 7. The source electrode 3 and the drain electrode 4 are made form Au, for example. The source electrode 3 and the drain electrode 4 are formed by mask vapor deposition. In conditions for the mask vapor deposition in the gate electrode formation step, a vacuum degree is $3\times10^{-4}$ Pa, and heating of the substrate 2 is unnecessary. Accordingly, the strip-like source electrode 3 and drain electrode 4 each having a thickness of 100 nm, a width of 100 μm, and a length of 500 μm can be formed on a surface of the gate insulating layer 5. In FIG. 9, the width of the source electrode 3 is indicated by arrows 301, and the width of the drain electrode 4 is indicated by arrows 303.

Subsequently, the semiconductor layer formation step (S14) is performed. In the semiconductor layer formation step, the semiconductor layer 9 is formed. The formation of the semiconductor layer 9 is performed by spraying the aqueous solution for semiconductor layer formation in such a manner as to cover the source electrode 3 and the drain electrode 4 using an inkjet device. The aqueous solution for semiconductor layer formation is prepared in the centrifugation step (S1) that is separately performed. The centrifugation step (S1) for preparing the aqueous solution for semiconctor layer formation will hereinafter be described.

In the centrifugation step (S1), an ultracentrifugation treatment is performed. The ultracentrifugation treatment is employed for preparing the aqueous solution for semiconductor layer formation to be used for forming the semiconductor layer 9. In the first embodiment, the aqueous solution for semiconductor layer formation is prepared as described below. To start with, an aqueous solution containing the single wall carbon nanotube and the surfactant is prepared. The surfactant to be used here may be any one of anionic, cationic, amphoteric, and nonionic surfactant as described in the foregoing. Also, it is possible to use one of the surfactants and also to use two or more of the surfactants in combination. In the first embodiment, 0.1 wt % of the single wall carbon nanotube (trade name "HiPco (registered trade name")"; manufactured by Carbon Nanotechnologies) and 1 wt % of SDS (manufactured by Wako Pure Chemical Industries, Ltd.) were mixed in 100 ml of pure water. By using a stirring device, the mixture was stirred at 200 rpm for about one hour, followed by shaking by an ultrasonic washing device for about 3 hours. At this stage, the single wall carbon nanotubes contained in the aqueous solution are stably dispersed in the aqueous solution due to the action of the surfactant. However, many of the single wall carbon nanotubes contained in the aqueous solution exist as an aggregate.

Therefore, the prepared aqueous solution is subjected to an ultracentrifugation treatment at about 40,000 rpm for 90 minutes by using an ultracentrifugation device (manufactured by Hitachi High-Technologies Corporation; ultracentrifugation device CP80WX). By subjecting the prepared aqueous solution to the ultracentrifugation treatment at about 40,000 rpm, a centrifugation force of about 150,000×g is applied to the aqueous solution. A supernatant of the aqueous solution after the ultracentrifugation treatment is collected to be used as the aqueous solution for semiconductor layer formation. The aggregated single wall carbon nanotubes are precipitated in the aqueous solution by the ultracentrifugation treatment. Therefore, the aqueous solution for semiconductor layer formation which is the supernatant of the aqueous solution is increased in proportion of the non-aggregated single wall carbon nanotubes as compared with the aqueous solution before ultracentrifugation treatment. It is sufficient insofar as the centrifugation step is performed in advance of the semiconductor layer formation step (S14).

Hereinafter, one example of inkjet device to be used in the semiconductor layer formation step (S14) will be briefly described with reference to FIG. 8. A horizontal direction as viewed from a lower end of the drawing sheet is set to a horizontal direction. As shown in FIG. 8, the ink jet device 400 is a so-called inkjet printer. In the inkjet device 400, holding frames 441 and 442 are provided upright on a rear end part of a base frame 402, and an X axis frame 404 is provided over the holding frames 441 and 442. A linear scale 405 forming the X axis is provided on the X axis frame 404. On the linear scale 405, a carriage 406 is placed in such a manner that the carriage 406 is slidable in a longitudinal direction of the linear scale 405. The carriage 406 holds printing heads 414 in which the aqueous solution for semiconductor layer formation is sealed. The carriage 406 is also provided with four driving circuit substrates 408 for respectively driving the print heads 414 of each color. An X axis motor 407 is provided at a right end part of the X axis frame 404. The X axis motor 407 allows reciprocating motion of the carriage 406 along the linear scale 405.

The base frame 402 is further provided with a Y axis frame 409 at a position orthogonal to the X axis frame 404. On the Y axis frame 409, a substantially rectangular flat platen 410 is provided in such a manner that the platen 410 can reciprocate in a longitudinal direction of the Y axis frame 409. A Y axis motor 411 is provided at the end of the Y axis frame 409. A Y axis motor 411 allows the reciprocating motion of the platen 410 along the Y axis. A flushing position 412 is provided at a left end part of the base frame 402. The flushing position 412 is a part at which a flushing operation is performed for the purpose of clearing up clogging of the print heads 414. A maintenance unit 413 is provided at a right end part of the base frame 402. The maintenance unit 413 performs a wiping operation on nozzle surfaces of the print heads 414 and a sucking operation (purge operation) of the aqueous solution for semiconductor layer formation inside nozzles of the print heads.

Hereinafter, a method for forming the semiconductor layer 9 using the above-described inkjet device 400 will be described. The formation of the semiconductor layer 9 is performed by discharging the aqueous solution for semiconductor layer formation prepared in the centrifugation step (S1) in such a manner as to cover the source electrode 3 and the drain electrode 4. The X axis motor 407 and the Y axis motor 411 are driven by a control unit provided in the inkjet device 400, so that the aqueous solution for semiconductor layer formation is discharged to a predetermined position. In this case, the aqueous solution for semiconductor layer formation may preferably be dropped with an alternating current of about 1 to 10 V being applied between the source electrode 3 and the drain electrode 4. Due to the action of the alternating current applied between the source electrode 3 and the drain electrode 4, longitudinal directions of the single wall carbon nanotubes contained in the aqueous solution for semiconductor layer formation are easily arranged to be parallel to a straight line connecting the source electrode 3 and the drain electrode 4. By increasing a proportion of the single wall carbon nanotubes of which the longitudinal directions are aligned in a direction connecting the source electrode 3 and the drain electrode 4 to each other by a shortest distance, it is possible to improve switching characteristics of the thin film transistor 1.

An amount of the aqueous solution for semiconductor layer formation to be discharged and a discharge region will be described. In the first embodiment, the source electrode 3 and the drain electrode 4 are formed with a gap that ensured the channel length of 30 μm being defined therebetween. Hereinafter, a direction of the channel length is referred to as a vertical direction, and a direction perpendicular to the channel length is referred to as a horizontal direction. The aqueous solution droplets for semiconductor layer formation are discharged at a 10 μm-pitch in such a manner as to cover the gap between the source electrode 3 and the drain electrode 4 as shown in FIG. 9. The aqueous solution droplets for semiconductor layer formation were discharged to form 10 dots in the vertical direction and 30 dots in the horizontal direction. An amount of the aqueous solution for semiconductor layer formation to be discharged once is several pico liters. The aqueous solution for semiconductor layer formation was discharged in a region of a length of 170 μm and a width of 370 μm including a dot diameter of about 80 μm of the aqueous solution droplet for semiconductor layer formation. In FIG. 9, a circle drawn in the semiconductor layer 9 represents a part of the dots formed by the aqueous solution droplets for semiconductor layer formation. After that, dry-fixing is performed by natural drying or in an incubation tank at 150° C. for about 10 minutes to form the semiconductor layer 9 containing the single wall carbon nanotubes. Thus, a channel having the channel length of about 30 μm and a channel width of about 370 μm is formed between the source electrode 3 and the drain electrode 4. In addition, in FIG. 9, the channel length is indicted by arrows 302, and the channel width is indicated by arrows 304.

In the first embodiment, the semiconductor layer 9 is formed by the inkjet method. Therefore, it is possible to produce the thin film transistor 1 provided with the semiconductor layer 9 containing the single wall carbon nanotubes by the simple method. Also, since the inkjet method is employed, it is possible to accurately supply the aqueous solution for semiconductor layer formation at the predetermined position. As a result, it is possible to form the semiconductor layer 9 in the predetermined form with high accuracy.

Lastly, the breakdown step (S15) may preferably be performed. Both of semiconductor and electroconductive single wall carbon nanotubes are included as the single wall carbon nanotubes contained in the semiconductor layer 9. In the breakdown step, a treatment for burning off the electroconductive single wall carbon nanotubes by energization is performed in order to leave only the semiconductor single wall carbon nanotubes. More specifically, a voltage is applied between the source electrode 3 and the drain electrode 4. Then only the electroconductive single wall carbon nanotubes are burnt off by heating as a result of the energization. Thus, the desired semiconductor layer 9 wherein only the semiconductor single wall carbon nanotubes are remained is formed. The breakdown step may be omitted as required.

Figure 10:
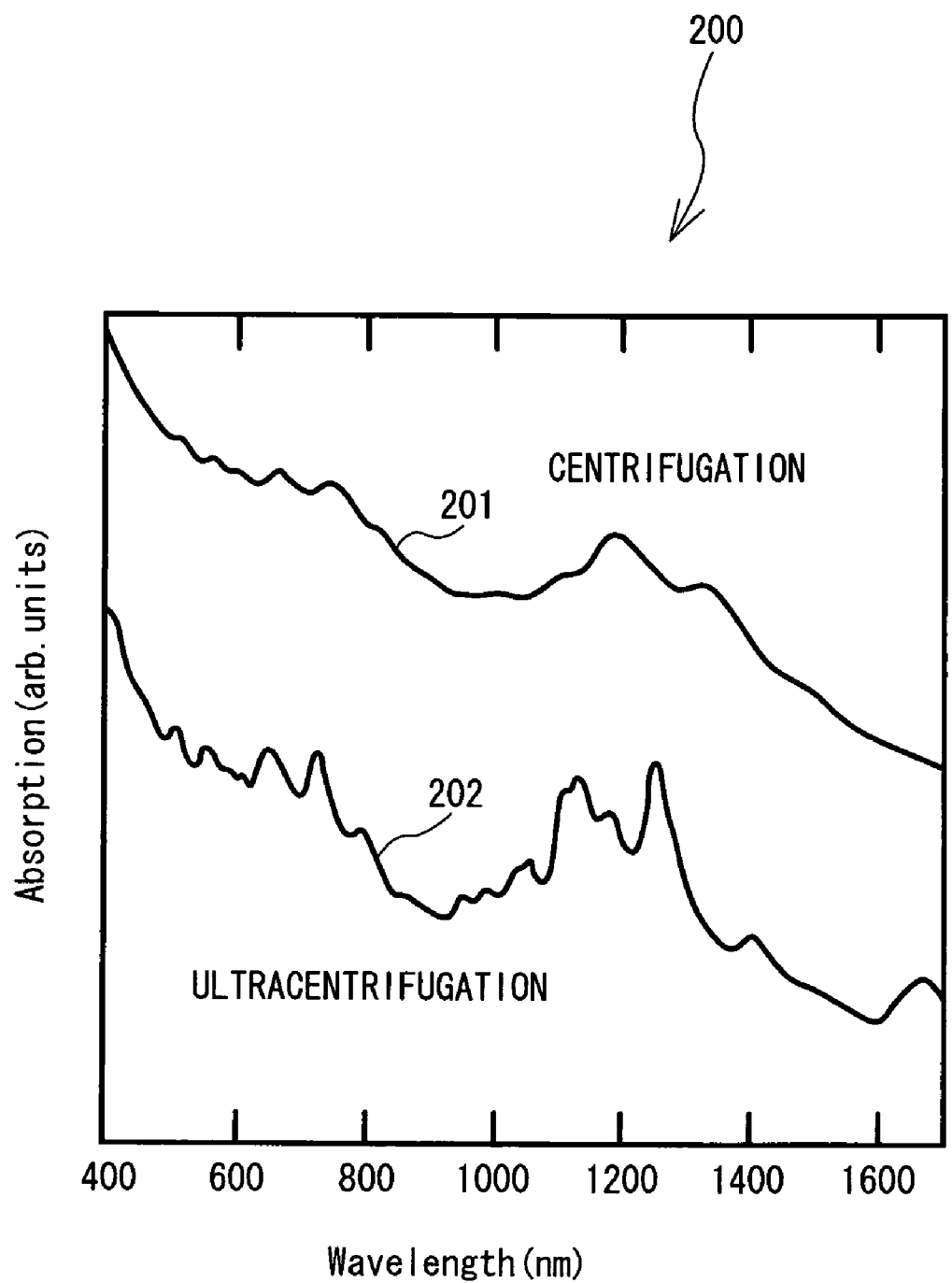
FIG. 10 is a graph indicating photoabsorption spectrums at a wavelength of 400 to 1700 nm of an aqueous solution for semiconductor layer formation in a first embodiment and an aqueous solution for semiconductor layer formation of a comparative example.

The thin film transistor 1 of the first embodiment is produced as described above in detail. Subsequently, a comparative test was performed particularly focusing on an effect of the centrifugation step in order to investigate properties of the thin film transistor 1 produced by the production method of the first embodiment. Hereinafter, the comparative test will be described with reference to FIG. 10 and FIG. 11.

Photoabsorption spectrums at a wavelength of 400 to 1700 nm of the aqueous solution for semiconductor layer formation of the first embodiment and an aqueous solution for semiconductor layer formation of Comparative Example were compared. The preparation method of the aqueous solution for semiconductor layer formation of the first embodiment and a preparation method of the aqueous solution for semiconductor layer formation of Comparative Example are different from each other only in centrifugation step. The aqueous solution for semiconductor layer formation of Comparative Example is a supernatant collected after subjecting the aqueous solution containing the single wall carbon nanotube and the surfactant that is the same as that of the first embodiment to centrifugation (centrifugation treatment) at 10,000 rpm for about 20 minutes (several thousands×g). The photoabsorption spectrum in the aqueous solution for semiconductor layer formation of Comparative Example is indicated by a curve 201, and the photoabsorption spectrum in the aqueous solution for semiconductor layer formation of the first embodiment is indicated by a curve 202. As shown in the graph 200 of FIG. 10, the photoabsorption spectrum of the aqueous solution for semiconductor layer formation of Comparative Example indicated by the curve 201 has an absorption peak having a wide line width near wavelengths of 1100 to 1200 nm. In contrast, the photoabsorption spectrum of the aqueous solution for semiconductor layer formation of the first embodiment indicated by the curve 202 has a peak having a considerably narrow line width near wavelengths of 1100 to 1200 nm. It has been known that the line width of the absorption peak near the wavelengths of 1100 to 1200 nm becomes wide in the case where the single wall carbon nanotubes are aggregated in the form of a bundle and becomes narrow when the single wall carbon nanotubes exist as being isolated from one another. Therefore, it is apparent that more aggregated single wall carbon nanotubes are contained in the aqueous solution for semiconductor layer formation of Comparative Example as compared with the aqueous solution for semiconductor layer formation of the first embodiment. In the graph 200 shown in FIG. 10, the photoabsorption amount value indicated by the curve 201 is higher than that indicated by the curve 202 over the whole wavelength region. That is to say, the photoabsorption amount of the aqueous solution for semiconductor layer formation of Comparative Example is larger than that of the aqueous solution for semiconductor layer formation of the first embodiment over the whole wavelength region. Such photoabsorption amounts indicate that the aggregated single wall carbon nanotubes are precipitated in the aqueous solution for semiconductor layer formation of the first embodiment by the ultracentrifugation treatment. In other words, the photoabsorption amounts indicate that the aqueous solution for semiconductor layer formation of Comparative Example that underwent the centrifugation treatment and the aqueous solution for semiconductor layer formation of the first embodiment that underwent the ultracentrifugation treatment are different from each other in concentration of the single wall carbon nanotubes.

Figure 11:
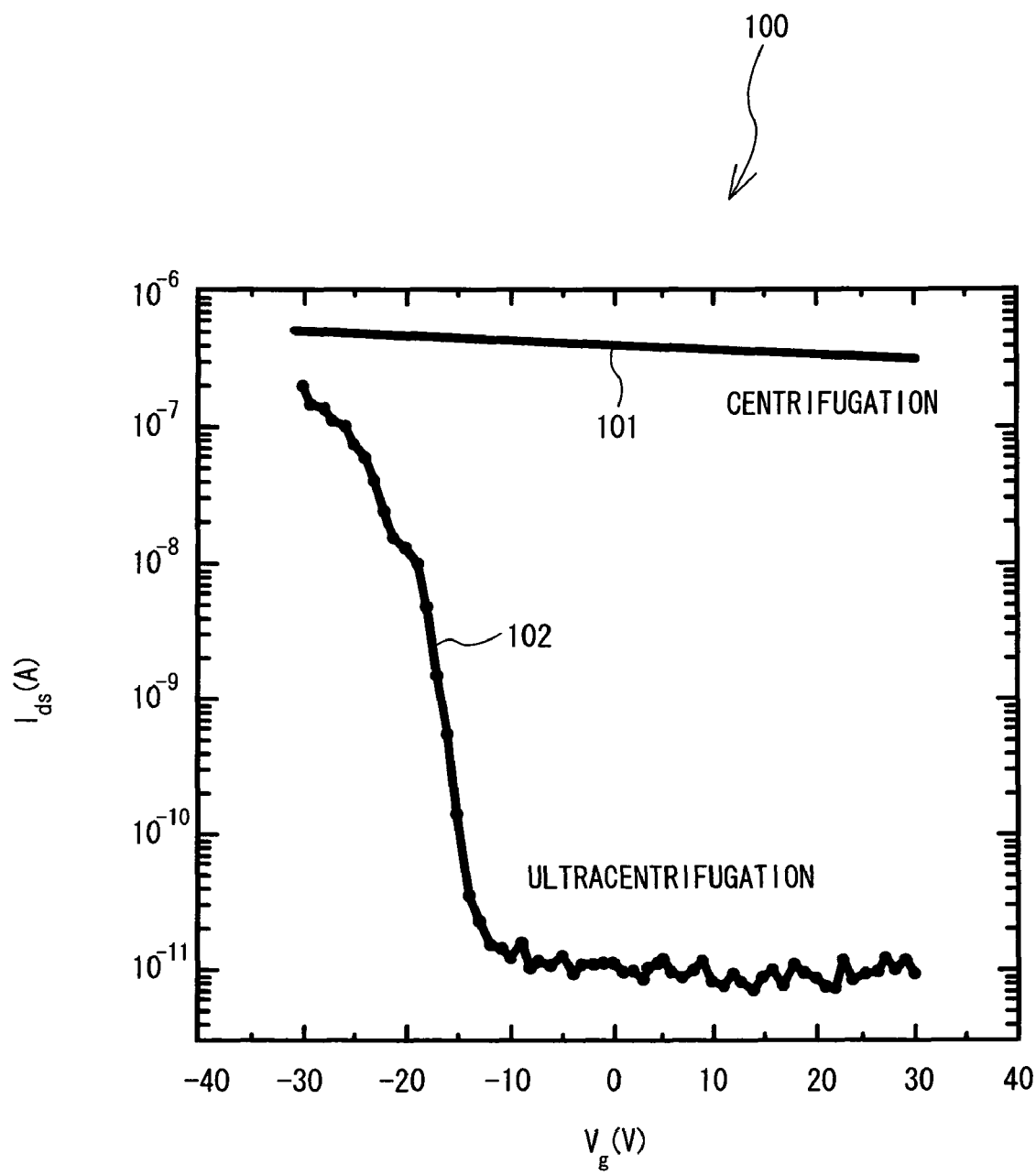
FIG. 11 is a graph showing amount of change in current value $I_{ds}$ flowing between the source electrode and the drain electrode with respect to amount of change in gate voltage $V_g$ (V) in each of a thin film transistor of the first embodiment and a thin film transistor of the comparative example.

Subsequently, transistor characteristics of the thin film transistor 1 produced by the above-described method and a thin film transistor of Comparative Example were measured. The measurement of transistor characteristics was performed by using a semiconductor parameter analyzer. In the thin film transistor of Comparative Example, a semiconductor layer was formed by using a supernatant after subjecting the aqueous solution to centrifugation at 10,000 rpm for about 20 minutes in the centrifugation step (S1). The thin film transistor of Comparative Example was produced by the same production method as described above except for the centrifugation step (S1). In other words, in the centrifugation step (S1), the ultracentrifugation treatment was performed in the production of thin film transistor 1, while the centrifugation treatment is performed in the production of the thin film transistor 1 of Comparative Example. Amount of change in current value $I_{ds}$ flowing between the source electrode and the drain electrode with respect to amount of change in gate voltage $V_g$ (V) in the thin film transistor of Comparative Example is indicated by a curve 101. Also, amount of change in current value $I_{ds}$ flowing between the source electrode and the drain electrode with respect to amount of change in gate voltage $V_g$ (V) in the thin film transistor of the first embodiment is indicated by a curve 102. Referring to FIG. 11, as indicated by the curve 101, the amount of change in the current value $I_{ds}$ flowing between the source electrode and the drain electrode with respect to the amount of change in gate voltage $V_g$ (V) is small in the thin film transistor of Comparative Example. In the thin film transistor of Comparative Example, an on/off ratio is about 1×10. In contrast, as indicated by the curve 102, the amount of change in the current value $I_{ds}$ flowing between the source electrode and the drain electrode with respect to the amount of change in gate voltage $V_g$ (V) in the thin film transistor of the first embodiment is larger than that of thin film transistor of Comparative Example. In the thin film transistor 1 of the first embodiment, an on/off ratio is $1 \times 10^4$ or more. In the centrifugation step (S1), the larger the size of the centrifugation force to be applied to the single wall carbon nanotubes is, the larger the amount of aggregated single wall carbon nanotubes precipitate. Accordingly, isolated single wall carbon nanotubes that are not aggregated remain in the supernatant. Therefore, it is considered that a semiconductor path ratio in a total conductive path is increased to improve the transistor characteristics when the semiconductor layer 9 is formed by using the aqueous solution for semiconductor layer formation after the ultracentrifugation.

Also, in a thin film transistor obtained by using an aqueous solution for semiconductor layer formation that has not been centrifuged, transistor characteristics become lower than those of the thin film transistor of Comparative Example, and an On/Off ratio thereof becomes smaller than 1×10. An off current is not suppressed because many aggregated single wall carbon nanotubes are present in the aqueous solution for semiconductor layer formation, and because many of the single wall carbon nanotubes are conductive single wall carbon nanotubes. Even in such case, the thin film transistor can operate as a transistor.

The conditions such as the number of revolutions and the revolution time in the centrifugation step are not limited insofar as the conditions enable sedimentation of the aggregated single wall carbon nanotubes, and, for example, the conditions under which a centrifugation force of 150,000×g is applied to the aqueous solution enable sedimentation of a large part of the aggregated single wall carbon nanotubes. Based on the above-described findings, it is suggested that the larger the centrifugation force to be applied to the aqueous solution containing the single wall carbon nanotubes and the surfactant during the centrifugation step is, the larger a degree of segmentation of the aggregated single wall carbon nanotubes is. Also, as the thin film transistor, it is suggested that the larger the centrifugation force to be applied to the aqueous solution containing the single wall carbon nanotubes and the surfactant in the centrifugation step (S1) is, the more the transistor characteristics are improved. Particularly, when the centrifugation force of 150,000×g or more (the centrifugation force in the ultracentrifugation) is applied to the aqueous solution in the centrifugation step (S1), a large part of the aggregated single wall carbon nanotubes in the aqueous solution is precipitated. Therefore, in the aqueous solution for semiconductor layer formation which is the supernatant of the aqueous solution, a ratio of the non-aggregated single wall carbon nanotubes is remarkably high. It is possible to obtain the thin film transistor having the large on/off ratio and the stable transistor characteristics by using the supernatant as the aqueous solution for semiconductor layer formation. Meanwhile, the thin film transistor obtained by using the aqueous solution containing the single wall carbon nanotube and the surfactant and obtained without centrifugation can operate as a transistor.

According to the production method for the bottom gate type thin film transistor 1 of the first embodiment, it is possible to stably disperse the single wall carbon nanotubes in the aqueous solution for semiconductor layer formation due to the action of the surfactant. More specifically, the surfactant covering the single wall carbon nanotubes becomes micelles so that the single wall carbon nanotubes are stably dispersed into the aqueous solution for semiconductor layer formation. In the case of using at least one of sodium deoxycholate and sodium dodecylsulfonate as the surfactant to be contained in the aqueous solution for semiconductor layer formation, it is possible to satisfactorily disperse the single wall carbon nanotubes into the aqueous solution for semiconductor layer formation even when an added amount of the surfactant is small. It is possible to form the semiconductor layer 9 in which the single wall carbon nanotubes are substantially uniformly arranged by forming the semiconductor layer 9 by using the aqueous solution for semiconductor layer formation in which the single wall carbon nanotubes are satisfactorily dispersed. Therefore, it is possible to obtain the thin film transistor 1 provided with the semiconductor layer 9 containing the single wall carbon nanotubes and having stable transistor characteristics. The thin film transistor 1 produced by the production method of the first embodiment is suitably used for microscopic devices such as a flexible display.

The single wall carbon nanotube has excellent material characteristics of a high electron speed and a high current density. Therefore, the thin film transistor 1 provided with the semiconductor layer 9 enables to improve carrier mobility as compared with the thin film transistor provide with an organic semiconductor layer. Also, since the single wall carbon nanotube is a material in the form of a thread and having high flexibility and tensile strength, it is possible to use the thin film transistor 1 for flexible devices.

A viscosity of the aqueous solution for semiconductor layer formation is substantially equal to that of water. Therefore, it is possible to simply form the semiconductor layer by using a simple coating process such as the inkjet method. In the inkjet method, a viscosity of the sample to be applied is required to be within the range of 1 to 20 mPa·s. Also, since it is possible to employ the inkjet method, it is possible to adjust a discharge amount of the aqueous solution for semiconductor layer formation, thereby making it easy to adjust a thickness of the semiconductor layer 9. In short, it is possible to easily form the semiconductor layer 9 having a desired thickness. Further, it is unnecessary to use a special material such as an ionic liquid for preparing the aqueous solution for semiconductor layer formation. Therefore, it is possible to produce the thin film transistor provided with the semiconductor layer containing the single wall carbon nanotubes at a low cost. Also, since the surfactant that is in the solid form at a room temperature is used, handling thereof such as scaling and storage is easy in the preparation of the aqueous solution for semiconductor layer formation.

Also, in the first embodiment, the supernatant of the aqueous solution that underwent the centrifugation step (S1) is used as the aqueous solution for semiconductor layer formation. In the centrifugation step (S1), the aggregated single wall carbon nanotubes contained in the aqueous solution containing the single wall carbon nanotubes and the surfactant are precipitated. Switching characteristics of the thin film transistor becomes more excellent along with a reduction in amount of aggregated single carbon nanotubes in the semiconductor layer 9. Therefore, it is possible to produce the thin film transistor which is excellent in switching characteristics by forming the semiconductor layer 9 that has the small ratio of aggregated single wall carbon nanotubes.

In the semiconductor layer formation step (S14), in the case where the semiconductor layer 9 is formed by applying the voltage between the source electrode 3 and the drain electrode 4, it is possible to further improve the switching characteristics of the thin film transistor 1. By the action of the applied alternating voltage, the longitudinal directions of the single wall carbon nanotubes contained in the aqueous solution for semiconductor layer formation are easily arranged to be parallel to the straight line connecting the source electrode 3 and the drain electrode 4 to each other by the shortest distance. Therefore, it is possible to improve the switching characteristics of the thin film transistor 1 by increasing the ratio of the single wall carbon nanotubes of which the longitudinal directions are in parallel to the straight line connecting the source electrode 3 and the drain electrode 4 to each other by the shortest distance. In addition, the straight line connecting the source electrode 3 and the drain electrode 4 to each other by the shortest distance and the direction of the channel length indicated by the arrows 302 in FIG. 9 are in parallel relationship.

This disclosure is not limited to the first embodiment described in detail above, and various modifications may be added within the range that does not deviate from the scope of this disclosure. For example, materials, sizes, shapes, and arrangements of the substrate 2, the gate electrode 6, the source electrode 3, the drain electrode 4, the gate insulating layer 5, and the semiconductor layer 9 forming the thin film transistor 1 are not limited to the case of the first embodiment and can be modified as required.

It is also possible to modify the added amounts of the single wall carbon nanotube and the surfactant used in the centrifugation step (S1) for preparing the aqueous solution for semiconductor layer formation as required. Also, the stirring conditions for the aqueous solution containing the single wall carbon nanotube and the surfactant and the conditions for ultracentrifugation treatment and the like can be modified as required and are not limited to the case of the first embodiment. For example, insofar as the conditions for subjecting the aqueous solution containing the single wall carbon nanotube and the surfactant to the centrifugation treatment is 150,000×g or more, it is possible to precipitate the aggregated single wall carbon nanotubes contained in the aqueous solution. Also, the aqueous solution for semiconductor layer formation may be prepared by omitting the ultracentrifugation treatment as described above.

Also, although the inkjet method is employed for forming the semiconductor layer in the semiconductor layer formation step (S14) in the first embodiment, it is possible to form the semiconductor layer 9 by using other coating process such as screen printing. Further, although a washing or heating treatment for reducing or eliminating the surfactant is not performed during the semiconductor layer formation step (S14) or after the semiconductor layer formation step in the first embodiment, it is possible to perform these treatments.

Figure 12:
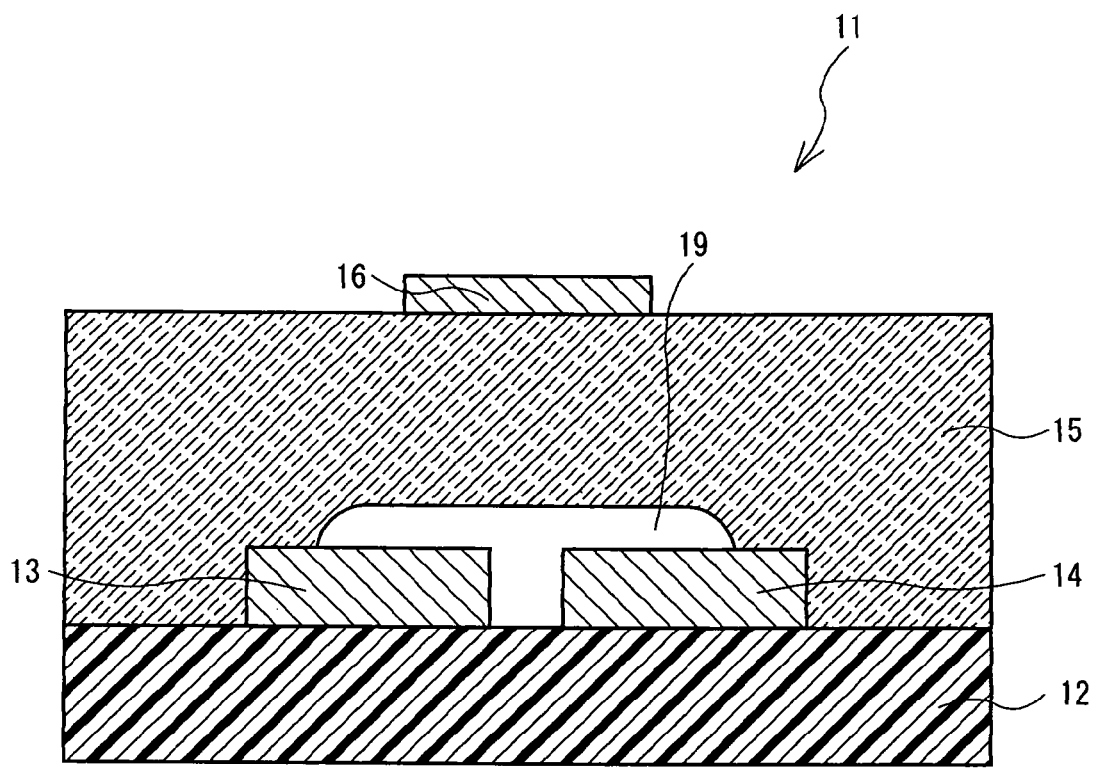
FIG. 12 is a sectional view of a thin film transistor of a second embodiment.

Hereinafter, as a second embodiment, a case of a thin film transistor 11 of a so-called "top gate type" will be described with reference to FIG. 12. In the "top gate type" thin film transistor 11, a gate electrode 16 is positioned above a source electrode 13 and a drain electrode 14.

The thin film transistor 11 is different from the "bottom gate type" thin film transistor 1 in structure, but materials of layers are identical with those of the "bottom gate type" thin film transistor. Therefore, in the second embodiment, description is given mainly on the structure and a production method of the thin film transistor 11, and description for the materials is omitted.

To start with, a section structure of the thin film transistor 11 will be described. The thin film transistor 11 shown in FIG. 12 has a plate-like substrate 12, and the source electrode 13 and the drain electrode 14 are provided on the substrate 12. A distance between a lateral part of the source electrode 13 close to a channel and a lateral part of the drain electrode 14 close to the channel is a channel length.

On a surface of the substrate 12 sandwiched between the source electrode 13 and the drain electrode 14, the semiconductor layer 19 is provided. A surface of the semiconductor layer 19, surfaces of the source electrode 13 and the drain electrode 14, and an upper surface of the substrate 12 are covered with a gate insulating layer 15. Further, on a surface of the gate insulating layer 15, a gate electrode 16 is provided at a position facing to the semiconductor layer 19.

Hereinafter, the production method for the thin film transistor 11 will be described with reference to FIG. 13 to FIG. 17. The diagrams shown in FIG. 14 to FIG. 17 schematically show partial sectional views in production steps corresponding to FIG. 2.

Figure 13:
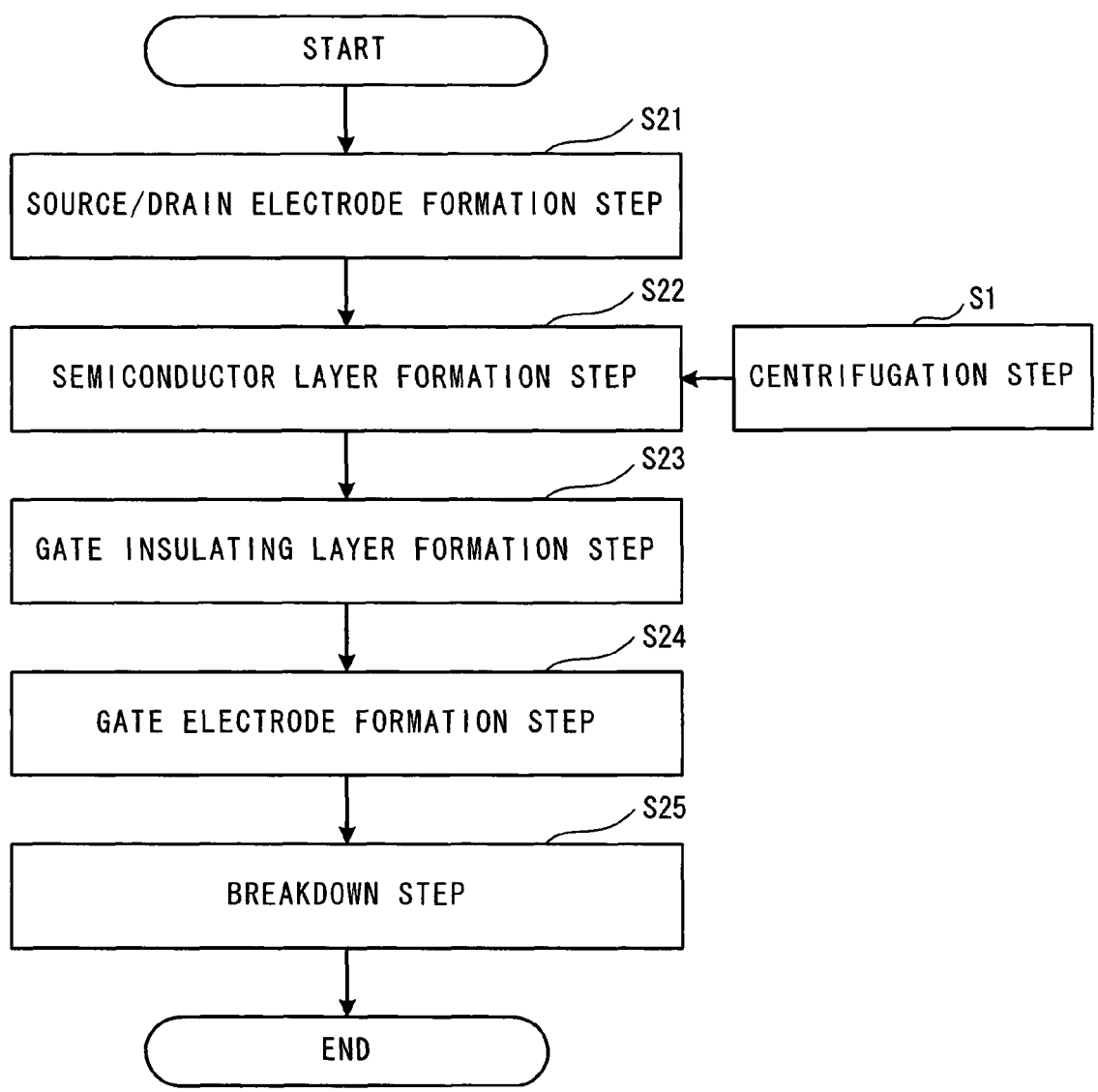
FIG. 13 shows a flow of producing a thin film transistor.

The production method for the thin film transistor 11 is formed of a source/drain electrodes formation step (S21), a semiconductor layer formation step (S22), a gate insulating layer formation step (S23), a gate electrode formation step (S24), and a break down step (S25) as shown in FIG. 13. In the source/drain electrode formation step (S21), the source electrode 13 and the drain electrode 14 are formed on the upper surface of the substrate 12. In the semiconductor formation step (S22), the semiconductor layer 19 is formed on the surface of the substrate 12 that is sandwiched between the source electrode 13 and the drain electrode 14. In the gate insulating layer formation step (S23), the gate insulating layer 15 is formed in such a manner as to cover the surface of the semiconductor layer 19 and the surfaces of the source electrode 13 and the drain electrode 14. In the gate electrode formation step (S24), the gate electrode 16 is formed on the surface of the gate insulating layer 15. In the break down step (S25), the electroconductive single wall carbon nanotubes contained in the semiconductor layer 19 are burnt off by energization. The aqueous solution for semiconductor layer formation used in the semiconductor layer formation step (S22) is separately prepared in a centrifugation step (S1). Hereinafter, each of the steps will be described in detail.

Figure 14:
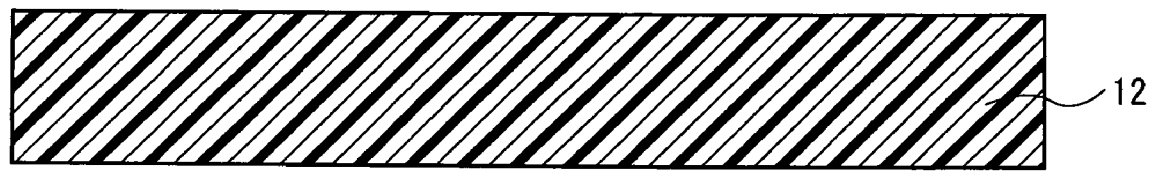
FIG. 14 is an exemplary view for illustrating a substrate.
Figure 15:
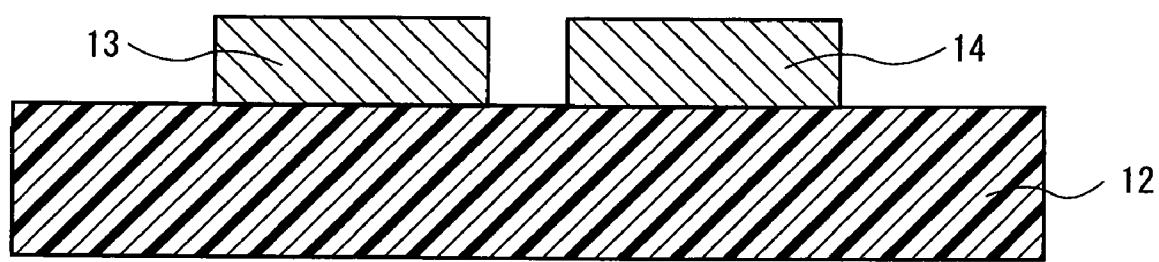
FIG. 15 is an exemplary view for illustrating a state in which a source electrode and a drain electrode are formed on a surface of the substrate shown in FIG. 14.

The source/drain electrodes formation step (S21) is firstly performed. In the source/drain electrodes formation step, the substrate 12 shown in FIG. 14 is sufficiently washed. Next, the substrate 12 is degassed. Subsequently, as shown in FIG. 15, the source electrode 13 and the drain electrode 14 are formed respectively on the surface of the gate insulating layer 15 by mask vapor deposition. The source electrode 13 and the drain electrode 14 are made from Au, for example. In conditions for the mask vapor deposition, a vacuum degree is $3 \times 10^{-4}$ Pa, and heating of the substrate 12 is unnecessary. Thus, the source electrode 13 and the drain electrode 14 each having a thickness of 100 nm are formed on the surface of the substrate 12.

Figure 16:
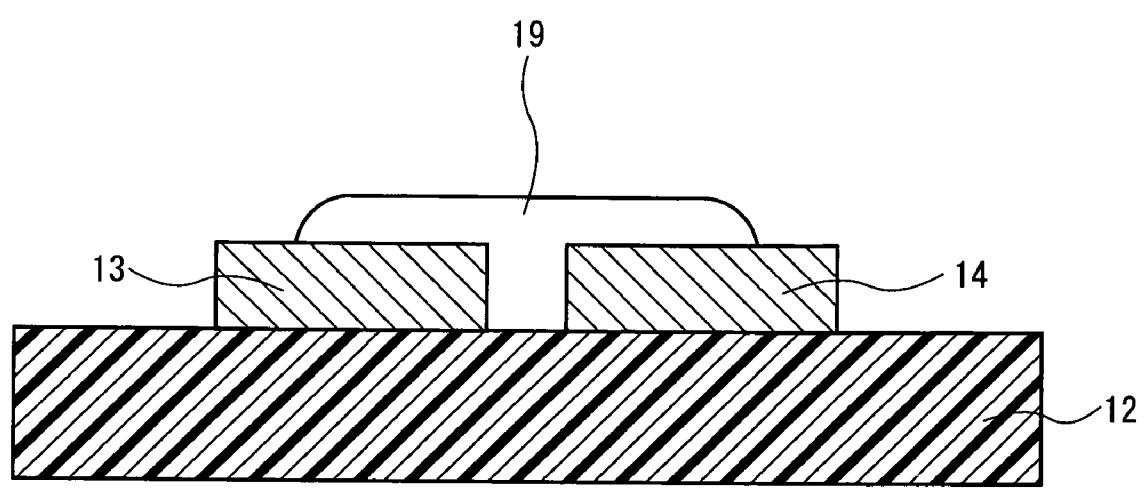
FIG. 16 is an exemplary view for illustrating a state in which the semiconductor layer is formed in such a manner as to cover the source electrode and the drain electrode shown in FIG. 15.

Subsequently, the semiconductor layer formation step (S22) is performed. In the semiconductor layer formation step, the aqueous solution for semiconductor layer formation is applied in such a manner as to cover the substrate 12 between the source electrode 13 and the drain electrode 14 as shown in FIG. 16. The aqueous solution for semiconductor layer formation is applied by the inkjet method. The aqueous solution for semiconductor layer formation is prepared in the centrifugation step (S1) separately performed. Details of the inkjet method and the centrifugation step (S1) are omitted since they are the same as those of the first embodiment.

Figure 17:
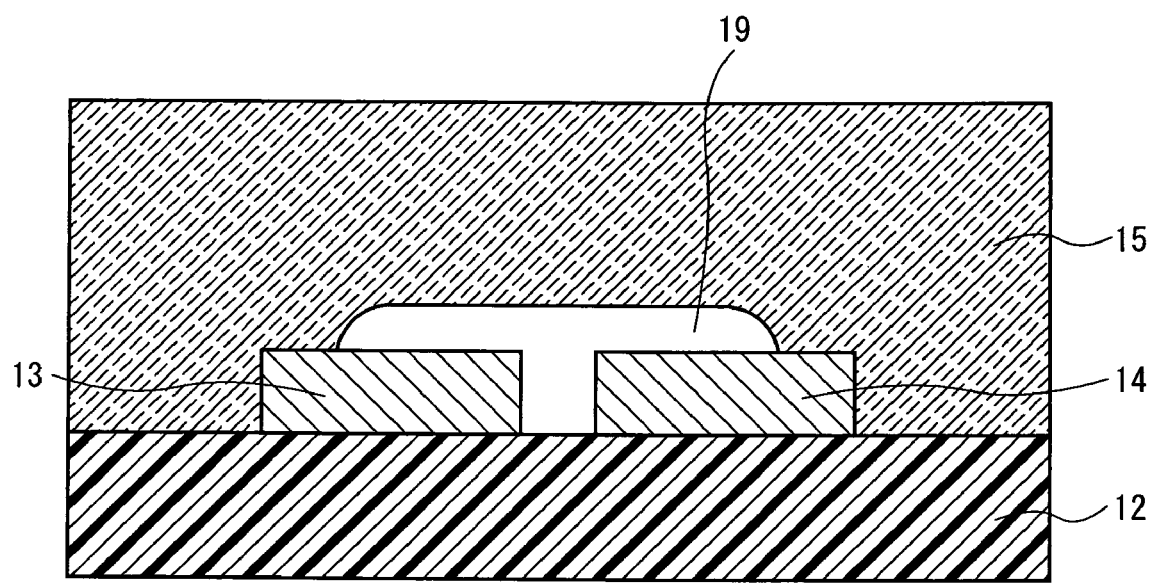
FIG. 17 is an exemplary view for illustrating a state in which the gate insulating layer is formed in such a manner as to cover a surface of the semiconductor layer and surfaces of the source electrode and the drain electrode shown in FIG. 16.

Next, the gate insulating layer formation step (S23) is performed. In the gate insulating layer formation step, the gate insulating layer 15 is formed in such a manner as to cover the surface of the semiconctor layer 19 and the surfaces of the source electrode 13 and the drain electrode 14 as shown in FIG. 17. The gate insulating layer 15 is made from polyimide (PI). The gate insulating layer 15 is formed by spin coating. In the spin coating, after applying a 5 wt % solution of a high heat resistance polyimide resin on the upper surface of the substrate 12, the substrate 12 is rotated horizontally. After that, the substrate 12 applied with polyimide resin is dried at 180° C. for about one hour to form the gate insulating layer 15 having a film thickness of 350 nm on the substrate 12.

Next, the gate electrode formation step (S24) is performed. In the gate electrode formation step, the gate electrode 16 is formed on the surface of the gate insulating layer 15 at a position facing to the semiconductor layer 19. The gate electrode 16 is made from Al. The gate electrode 16 is formed by mask vapor deposition. In conditions for the mask vapor deposition in this case, a vacuum degree is $3\times10^{-4}$ Pa, and heating of the substrate 12 is unnecessary. Thus, the gate electrode 16 having a film thickness of 60 nm is formed on the surface of the gate insulating layer 15, and it is possible to produce the thin film transistor 11 shown in FIG. 12.

Lastly, the breakdown step (S25) may preferably be performed. The breakdown step is a step of leaving only the semiconductor single wall carbon nanotubes by burning off the electroconductive single wall carbon nanotubes contained in the semiconductor layer 19 by energization. Description of details of the breakdown step is omitted since the details are the same as those of the first embodiment. The breakdown step may be omitted as required.

It is possible to achieve the same effect as the first embodiment according to the production method for the thin film transistor 11 of the second embodiment described in detail above. Further, since the source electrode 13 and the drain electrode 14 that requires the highest position accuracy are formed on the flat substrate 12, the formation is performed with good position accuracy as compared with the bottom gate type in which the source electrode and the drain electrode are formed on the gate insulating film.

This disclosure is not limited to the second embodiment described in detail above, and various modifications may be added within the range that does not deviate from the scope of this disclosure. For example, materials, sizes, shapes, and arrangements of the substrate 12, the gate electrode 16, the source electrode 13, the drain electrode 14, the gate insulating layer 15, and the semiconductor layer 19 forming the thin film transistor 11 are not limited to the case of the second embodiment and can be modified as required.

Also, although the inkjet method is employed for forming the semiconductor layer 19 in the semiconductor layer formation step (S22) in the second embodiment, it is possible to form the semiconductor layer 19 by using other coating process such as screen printing. Further, although a washing or heating treatment for reducing or eliminating the surfactant is not performed during the semiconductor layer formation step (S22) or after the semiconductor layer formation step in the second embodiment, it is possible to perform these treatments.

The thin film transistors and the production methods thereof of this disclosure are applicable to thin film transistors of the so-called bottom gate type and the top gate type as well as to production methods thereof.

The apparatus and methods described above with reference to the various embodiments are merely examples. It goes without saying that they are not confined to the depicted embodiments. While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

What is claimed is:

1. A method of producing a thin film transistor comprising:
   a gate electrode formation step that forms a gate electrode on a substrate;
   a gate insulating layer formation step that forms a gate insulating layer on the substrate in such a manner as to cover the gate electrode formed in the gate electrode formation step;
   a source/drain electrodes formation step that forms a source electrode and a drain electrode on the gate insulating layer; and
   a semiconductor layer formation step that applies an aqueous solution for semiconductor layer formation which is an aqueous solution comprising at least a single wall carbon nanotube and a surfactant, which is at least one of sodium deoxycholate and sodium dodecylsulfonate, between the source electrode and the drain electrode formed in the source/drain electrodes formation step by a coating process to form a semiconductor layer comprising the single wall carbon nanotube.

2. The method of producing a thin film transistor according to claim 1, wherein the coating process is an inkjet method.

3. The method of producing a thin film transistor according to claim 1, wherein the surfactant is a solid at a room temperature.

4. The method of producing a thin film transistor according to claim 1, comprising:
   a centrifugation step that centrifuges an aqueous solution containing the single wall carbon nanotube and the surfactant, wherein the aqueous solution for semiconductor layer formation is a supernatant of the aqueous solution centrifuged in the centrifugation step.

5. The method of producing a thin film transistor according to claim 1, wherein, in the semiconductor layer formation step, the aqueous solution for semiconductor layer formation is applied while applying an alternating voltage between the source electrode and the drain electrode.

6. A method of producing a thin film transistor, comprising:
   a source/drain electrodes formation step that forms a source electrode and a drain electrode on a substrate;
   a semiconductor layer formation step that applies an aqueous solution for semiconductor layer formation which is an aqueous solution comprising at least a single wall carbon nanotube and a surfactant, which is at least one of sodium deoxycholate and sodium dodecylsulfonate, between the source electrode and the drain electrode formed in the source/drain electrodes formation step by a coating process to form a semiconductor layer comprising the single wall carbon nanotube;
   a gate insulating layer formation step that forms a gate insulating layer in such a manner as to cover surfaces of the source electrode, the drain electrode, and the semiconductor layer; and
   a gate electrode formation step that forms a gate electrode on the gate insulating layer formed in the gate insulating layer formation step.

7. The method of producing a thin film transistor according to claim 6, wherein the coating process is an inkjet method.

8. The method of producing a thin film transistor according to claim 6, wherein the surfactant is a solid at a room temperature.

9. The method of producing a thin film transistor according to claim 6, comprising:

a centrifugation step that centrifuges an aqueous solution containing the single wall carbon nanotube and the surfactant, wherein the aqueous solution for semiconductor layer formation is a supernatant of the aqueous solution centrifuged in the centrifugation step.

10. The method of producing a thin film transistor according to claim 6, wherein, in the semiconductor layer formation step, the aqueous solution for semiconductor layer formation is applied while applying an alternating voltage between the source electrode and the drain electrode.

* * * * *